(12) United States Patent
Xin et al.

(10) Patent No.: US 7,811,634 B2
(45) Date of Patent: Oct. 12, 2010

(54) CONTROLLED SULFUR SPECIES DEPOSITION PROCESS

(75) Inventors: Yongbao Xin, Mississauga (CA); Jim Stiles, Toronto (CA); Chi Kit Leung, Mississauga (CA); Terry Hunt, Acton (CA); Joe Acchione, Caledon (CA)

(73) Assignee: iFire IP Corporation, Oakville, Ontario (CA)

( * ) Notice: Subject to any disclaimer, the term of this patent is extended or adjusted under 35 U.S.C. 154(b) by 1223 days.

(21) Appl. No.: 10/767,912

(22) Filed: Jan. 29, 2004

(65) Prior Publication Data

US 2005/0042376 A1 Feb. 24, 2005

Related U.S. Application Data

(60) Provisional application No. 60/443,540, filed on Jan. 30, 2003.

(51) Int. Cl.
*C23C 16/00* (2006.01)

(52) U.S. Cl. .................................. 427/255.29; 427/64

(58) Field of Classification Search ............ 427/255.28, 427/255.11, 248.1, 255.29, 255.34, 64, 255.38, 427/595; 428/690; 204/192.1
See application file for complete search history.

(56) References Cited

U.S. PATENT DOCUMENTS

| | | | |
|---|---|---|---|
| 5,431,851 A | 7/1995 | Karam et al. | |
| 5,652,067 A | 7/1997 | Ito et al. | |
| 5,788,882 A | 8/1998 | Kitai et al. | |
| 5,883,465 A | 3/1999 | Inoguchi et al. | |
| 5,897,812 A | 4/1999 | Kitai et al. | |
| 6,071,335 A * | 6/2000 | Braggs et al. | 106/416 |
| 6,153,123 A | 11/2000 | Hampden-Smith et al. | |
| 6,241,477 B1 * | 6/2001 | Brezoczky et al. | 417/48 |
| 6,262,531 B1 | 7/2001 | Inoguchi et al. | |
| 6,627,251 B2 * | 9/2003 | Yano et al. | 427/66 |
| 6,783,590 B2 * | 8/2004 | Lindfors et al. | 117/89 |
| 2001/0030302 A1 | 10/2001 | Struye et al. | |
| 2002/0079835 A1 | 6/2002 | Lee | |
| 2002/0081455 A1 | 6/2002 | Lee | |
| 2002/0122895 A1 | 9/2002 | Cheong et al. | |
| 2002/0192498 A1 | 12/2002 | Cheong et al. | |
| 2003/0000829 A1 | 1/2003 | Kosyachkov | |
| 2003/0071568 A1 * | 4/2003 | Lowery et al. | 313/512 |

FOREIGN PATENT DOCUMENTS

| | | |
|---|---|---|
| EP | 1 279 718 A2 | 1/2003 |
| WO | WO 02/051960 | 7/2002 |
| WO | WO 02097155 | 12/2002 |

* cited by examiner

*Primary Examiner*—Michael Cleveland
*Assistant Examiner*—Robert Vetere
(74) *Attorney, Agent, or Firm*—Fay Sharpe LLP

(57) ABSTRACT

The present invention is a method for the deposition of a thin film of a pre-determined composition onto a substrate, the thin film comprising ternary, quaternary or higher sulfide compounds selected from the group consisting of thioaluminates, thiogallates and thioindates of at least one element from Groups IIA and IIB of the Periodic Table. The method comprises volatizing at least one source material of a sulfide of a pre-determined composition to form a sulfur-bearing thin film composition on a substrate and simultaneously inhibiting any excess quantity of sulfur-bearing species volatilized from the at least one source material from impinging on the substrate. The method improves the luminance and emission spectrum of phosphor materials used for full color ac electroluminescent displays employing thick film dielectric layers with a high dielectric constant.

38 Claims, 6 Drawing Sheets

US 7,811,634 B2

CONTROLLED SULFUR SPECIES DEPOSITION PROCESS

This application claims priority from U.S. Provisional Application Ser. No. 60/443,540, filed on Jan. 30, 2003.

FIELD OF THE INVENTION

The present invention relates to a method for the deposition of multi element thin film compositions. More specifically, the invention is a method for the deposition of a phosphor composition where the amount of sulfur provided in the deposited phosphor composition is controlled. The method is particularly suitable for the deposition of phosphor compositions comprising a thioaluminate, thiogallate or thioaluminate of Group IIA and Group IIB elements where the source material(s) include sulfides that contain at least some of the elements comprising the deposited phosphor film. Further, the method is particularly useful for the deposition of phosphors for full colour ac electroluminescent displays employing thick film dielectric layers with a high dielectric constant.

BACKGROUND TO THE INVENTION

Thick film dielectric structures as exemplified by U.S. Pat. No. 5,432,015 (the entirety of which is incorporated herein by reference) are typically fabricated on ceramic substrates and provide superior resistance to dielectric breakdown, as well as a reduced operating voltage compared to thin film electroluminescent (TFEL) displays fabricated on glass substrates. When deposited on a ceramic substrate, the thick film dielectric structure withstands higher processing temperatures than TFEL devices on glass substrates. The increased tolerance to higher temperatures facilitates annealing of the phosphor films at higher temperatures to improve luminosity. However, even with the enhanced luminosity that is obtained, it is desirable to further increase the luminous efficiency of the devices to enable an improvement in overall energy efficiency and reduction in power consumption.

The Applicant has developed various methods for the deposition of phosphors used in a thick film dielectric electroluminescent device. For example, PCT CA01/01823 (the disclosure of which is incorporated herein in its entirety) discloses a method, preferably electron beam vaporization, for the deposition of a ternary, quaternary or similar phosphor composition, in which components of the composition are located on different sources. In particular, the compositions are thioaluminates, thiogallates or thioindates of Group IIA and Group IIB elements, and the sulfides that form such compounds are located on the different sources. PCT CA01/01234 (the disclosure of which is incorporated herein in its entirety) discloses a dual source phosphor deposition method using dual source electron beam deposition. The various compounds of the first and second sources are in the ratios required to provide the required composition of the phosphor. The deposited phosphors are preferably blue emitting europium activated barium thioaluminate. PCT CA02/00688 (the disclosure of which is incorporated herein in its entirety) discloses a single-source sputtering method for depositing controlled composition multi-element phosphor films. The method utilizes a source material in the form of a single dense target that has a composition different from the desired film composition of the phosphor. The concentrations of light chemical elements relative to heavier chemical elements in the target composition of the process is higher than desired in the deposited films.

The aforementioned patent applications disclose desirable phosphors and methods to deposit the phosphors for use in thick film dielectric electroluminescent displays. However, it is always desirable to provide new methods to further improve luminance and luminous efficiency of the phosphor compositions.

SUMMARY OF THE INVENTION

The invention is a method for the deposition of multi element thin film compositions for thick film dielectric electroluminescent devices. In the method, the amount of sulfur is controlled in the deposition chamber during deposition of the thin film composition. In this manner, the amount of sulfur impinging on the deposition substrate, and thus incorporated into the thin film composition, is controlled. The method of the invention in particularly useful for the deposition of phosphor compositions comprising ternary, quaternary or higher sulfur-bearing compounds, preferably selected from the group consisting of thioaluminates, thiogallates and thioindates of at least one element from Groups IIA and IIB of the Periodic Table. Phosphors deposited in accordance with the method of the invention exhibit improved luminance and luminous efficiency compared with methods of the prior art.

In the method, one or more source materials that make up the composition of the deposited phosphor, are deposited onto a suitable substrate using for example, low pressure physical vapour deposition methods. The relative volatization of the source materials is controlled to obtain the desired ratio of metal species on the deposition substrate. A gettering or condensing material is provided substantially adjacent the source material(s) in order to remove, prevent and/or minimize any excess sulfur-bearing species from depositing on the deposition substrate and thus incorporating into the deposited phosphor composition. This is conducted at a temperature sufficiently low to prevent re-evaporation of the condensed sulfur-bearing species from the gettering or condensing material.

The getting or condensing material is of sufficient surface area to effectively absorb or condense any excess sulfur-bearing species where such excess quantity is defined as an amount in excess of that required to provide the desired composition of the thin film phosphor composition. This is readily understood by one of skill in the art. An excess quantity of sulfur deposited within the phosphor composition may have a deleterious effect on the luminosity of the deposited phosphor composition.

According to an aspect of the present invention, there is provided a method for the deposition of a thin film of a pre-determined composition onto a substrate, the thin film comprising ternary, quaternary or higher sulfide compounds selected from the group consisting of thioaluminates, thiogallates and thioindates of at least one element from Groups IIA and IIB of the Periodic Table, the method comprising:

volatizing at least one source material comprising a sulfide that forms said pre-determined composition to form a sulfur-bearing thin film composition on a substrate; and minimizing any excess quantity of sulfur-bearing species volatilized from the at least one source material from impinging on said substrate.

According to another aspect of the present invention, there is provided a method for the deposition of a thin phosphor film of a pre-determined composition onto a substrate, the phosphor film comprising ternary, quaternary or higher sulfide compounds selected from the group consisting of thioaluminates, thiogallates and thioindates of at least one element from Groups IIA and IIB of the Periodic Table, the method comprising:

volatizing at least one source material comprising a sulfide that forms said pre-determined composition to form a sulfur-bearing thin film composition on a substrate;

simultaneously minimizing any excess quantity of sulfur-bearing species volatilized from the at least one source material from impinging on said substrate; and condensing or removing oxygen and/or water from evaporant from said at least one source material.

According to another aspect of the present invention is a method for the deposition of a thin film of a pre-determined composition onto a substrate, said composition comprising a ternary, quaternary or higher composition, said method comprising:

(i) providing a pellet of one sulfide as a source material, the sulfide comprising the components of said pre-determined composition, said pellet additionally containing dopant for said pre-determined composition;

(ii) effecting vapour deposition of said pre-determined composition onto said substrate by vaporizing said pellet with an electron beam;

(iii) monitoring the rate of vaporizing of sulfide from said pellet; and (iv) simultaneously removing any excess quantity of sulfur-bearing species volatilized from said pellet to inhibit said excess from impinging on said substrate.

In embodiments of the invention, the deposited thin film composition is a phosphor composition comprising an europium activated barium thioaluminate or europium activated calcium thioaluminate phosphor composition.

In a preferred embodiment, any excess quantity of sulfur-bearing species generated from the source material(s) within the deposition chamber is removed from the chamber by the provision of a gettering or condensing material substantially adjacent to the source material(s) to absorb or condense any excess sulfur-bearing species generated by the volatization of the source material(s). This is done at a temperature sufficiently low to prevent re-evaporation of the condensed sulfur-bearing species. The temperature to prevent re-evaporation is established as is known to those of skill in the art, by looking up the equilibrium vapor pressure data as a function of temperature for the species in question and selecting a temperature that is below that for which the equilibrium vapor pressure is below the base pressure for the deposition process. Generally, it is convenient to select for sulfur-bearing species a temperature near that at which liquid nitrogen boils which is 77° Kelvin. The gettering or condensing material has a sufficient surface area to effectively condense/absorb any excess sulfur-bearing species as is understood by one of skill in the art.

In a further embodiment of the invention, one or more agents may be further provided to: (a) minimize any excess of sulfur-bearing species that may also contain oxygen such as for example $SO_2$; and, (b) to condense or remove molecular oxygen and/or water from the flux of evaporant emitted from the source material(s) and prevent it impinging on the deposition substrate within the deposition chamber. Oxygen may originate from the evaporation sources of sulfide if they contain one or more oxygen-bearing impurities such as sulfate or sulfite compounds and water. Such agents are preferably provided substantially adjacent the source material(s) used in the deposition method.

In yet another embodiment of the invention, a volatile source of sulfur, preferably atomic sulfur, is provided in the deposition chamber to make up for any deficiency of sulfur in the deposited phosphor film relative to the desired amount. The volatile source of sulfur should be injected into the chamber such that the sulfur impinges uniformly on the deposition substrate.

According to another aspect of the present invention is a method for the deposition of a thin film of a pre-determined composition onto a substrate, said composition comprising a ternary, quaternary or higher composition, said method comprising:

(i) providing a pellet of at least one sulfide as a first source material and providing a pellet of at least one sulfide as a second source material, the sulfides on the first and second source materials being different, said sulfides being the components of said composition, at least one of the pellets on the first and second source materials additionally containing dopant for the composition;

(ii) effecting vapour deposition of said composition on said substrate by simultaneously vaporizing the pellets of the first and second source materials with separate electron beams;

(iii) independently monitoring the rate of vaporizing of sulfide from said first and said second source materials; and (iv) removing any excess quantity of sulfur-bearing species volatilized from said first and second source materials to inhibit said excess from impinging on said substrate.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from said detailed description.

BRIEF DESCRIPTION OF THE DRAWINGS

The present invention will become more fully understood from the detailed description given herein and from the accompanying drawings, which are given by way of illustration only and do not limit the intended scope of the invention.

DETAILED DESCRIPTION OF THE INVENTION

The present invention is a method for depositing thin film compositions and in particular thin film phosphor compositions comprising ternary, quaternary or higher sulfur-bearing compounds where the amount of sulfur deposited onto the deposition substrate, and thus into the deposited phosphor composition is controlled by controlling the amount of sulfur-bearing species in the vapour deposition atmosphere. This is accomplished by gettering or condensing any excess sulfur-bearing species volatized from the source or sources into the deposition atmosphere to prevent an excess of sulfur impinging or the deposition substrate and thus incorporating into the deposited phosphor composition.

The vapour deposition method of the invention is particularly useful for the deposition of phosphor compositions onto substrates where the phosphor compositions are selected from the group consisting of thioaluminates, thiogallates and thioindates of at least one element from Groups IIA and IIB of the Periodic Table having a controlled and desired sulfur content. Using the method of the present invention, phosphors with a high luminosity and useful emission colour are obtained.

The vapour deposition method of the present invention may be effected from a single source material or alternatively multiple source materials, so long as the selected single source or multiple sources form the pre-determined composition on the substrate including the activator species. A variety of vapour deposition methods may be used in the present invention including but not limited to sputtering, electron beam, or thermal evaporation. The preferred method is electron beam deposition. The temporal variation of deposition of the components onto the substrate from the source material(s) used that form the deposited phosphor composition is monitored and controlled to effect simultaneous vapour deposition from the source material(s) as taught in Applicant's PCT CA01/01823 (the disclosure of which is incorporated herein by reference in its entirety). In the deposition method of the present invention, the flux of sulfur incident on the deposition substrate is controlled to obtain the desired sulfur content in the deposited film.

The sulfur deposition flux may be controlled by controlling the partial pressure of sulfur within the deposition chamber. However, for this to be successful, the sulfur-bearing species comprising the process atmosphere must on average contain a constant number of sulfur atoms per molecule of vapour. If the sulfur-bearing species contain a variable number of sulfur atoms, then the mass density of the sulfur in the chamber will not bear a fixed relationship to the partial pressure of sulfur and the deposition rate of sulfur will vary in accordance with the relative abundance of molecules with different numbers of sulfur atoms.

Figure 1:
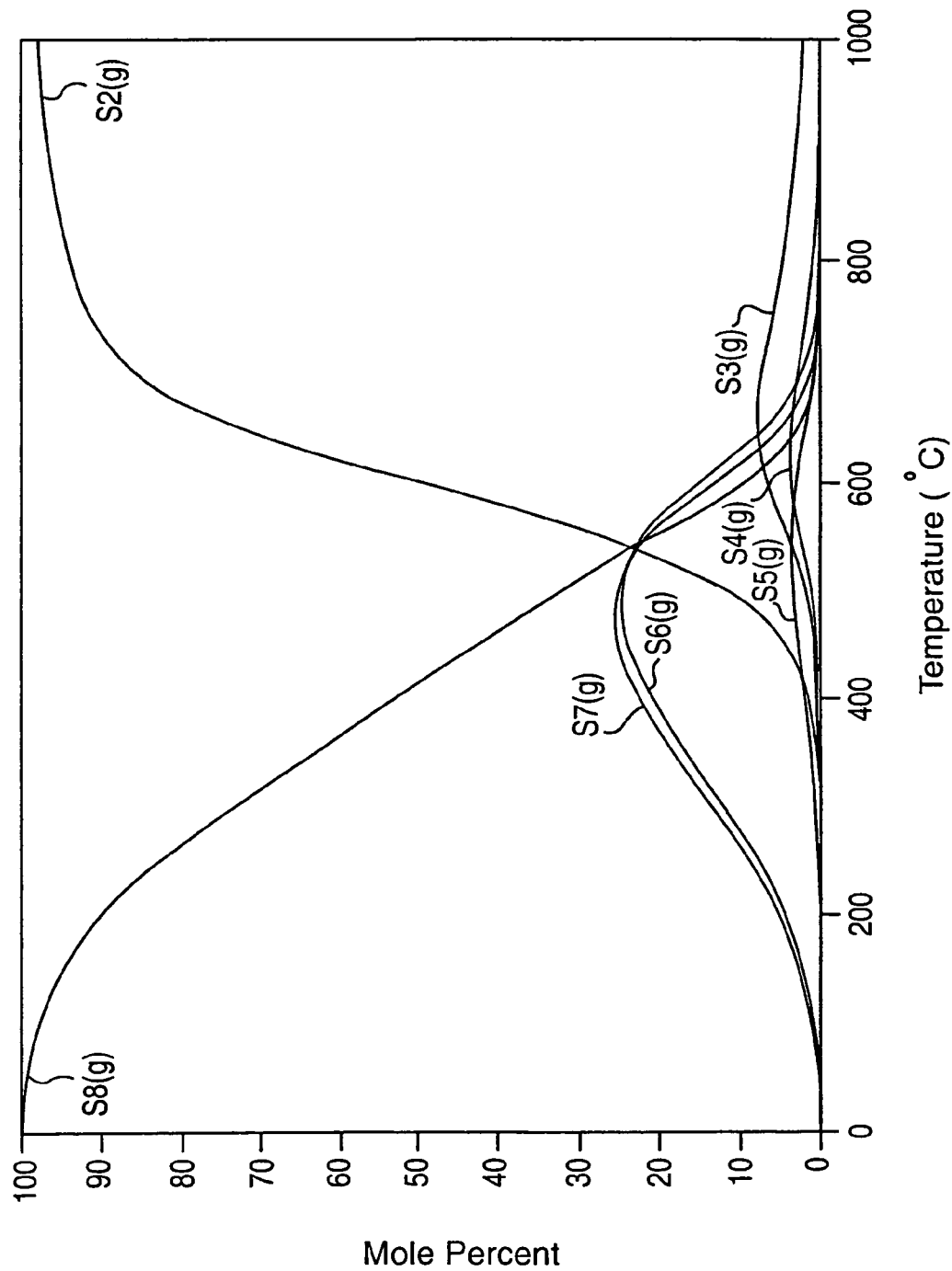
FIG. 1 is a diagram showing the sulfur species contributing to the vapour pressure of sulfur versus temperature.

It is also difficult to control the partial pressure of the sulfur in the deposition chamber if the sulfur molecules comprising the vapour in the deposition chamber originate from different locations. For example, if the vapour molecules arise from elemental sulfur that has condensed on the walls of the chamber that are at a temperature below about 500° C., the evaporated sulfur will comprise predominantly rings of sulfur atoms such as $S_6$, $S_7$ or $S_8$. FIG. 1 shows the equilibrium abundance of sulfur species contributing to the sulfur vapour pressure as a function of temperature. If the vapour molecule is hydrogen sulfide, it contains only one sulfur atom. If the sulfur arises from the electron beam heating of a sulfide source material, the sulfur bearing species may comprise a range of species from atomic sulfur to $S_8$ to molecules or molecular clusters of the sulfide source material. Thus the mass density of sulfur in the deposition chamber can vary by as much as a factor of eight at a given partial pressure of sulfur species, depending on the mix of these species. If other vapour species such as oxygen, water or sulfur dioxide are present, control of the mass density of vaporized sulfur becomes even more difficult.

The present invention overcomes the aforementioned limitations by providing a mechanism to control the sulfur content of a deposited phosphor film by controlling the mass transport of sulfur vapour impinging on the deposition substrate and thus being deposited into the deposited phosphor composition. This control ensures that the sulfur-containing vapour molecular species caused to impinge on the deposition substrate have on average a substantially time invariant number of sulfur atoms per molecule. Furthermore, the sulfur partial pressure during the deposition process is controlled to a value commensurate with the desired sulfur content in the deposited film. Suitable sulfur partial pressure ranges to be used in the present invention are commensurate with that known in the art for sulfide film deposition using electron beam, thermal evaporation or sputtering techniques and further using one or more source materials. For example, if electron beam evaporation is used as the deposition method of the invention, then sulfur may be provided as hydrogen sulfide at a partial pressure range of about $1\times10^{-5}$ to $1\times10^{-4}$ torr.

The time invariant mix of sulfur-bearing species may include sulfide molecules or clusters of sulfide molecules, molecular sulfur, atomic sulfur or hydrogen sulfide. Preferably the fraction of molecular sulfur species making up the mix, particularly those with higher molecular weight, is kept to a minimum. The method of the invention provides that any excess molecular sulfur species whose concentration varies with time during the deposition are condensed or absorbed and thus removed from the deposition atmosphere to prevent such species from impinging on the deposition substrate thus not be incorporated into the deposited phosphor composition. This is also effected by maintaining a low deposition atmosphere pressure, as discussed above, that the mean free path for sulfur-bearing vapour species is sufficiently long that there is no substantial probability of collisions between the various sulfur-bearing species in the deposition atmosphere so as to create a time varying population distribution of species containing different numbers of sulfur atoms.

The control of the sulfur content being deposited onto the substrate is effected by the use of a material or materials that absorb or condense and thus essentially remove any excess sulfur-bearing species from the deposition atmosphere. Such a material(s) is herein referred to as a gettering or condensing material and is defined as any material known to those of skill in the art that absorb or condense sulfur species, the overall effect being removal of excess sulfur species from the deposition atmosphere and prevent it impinging on the deposition substrate. Such materials may include but are not limited to selective getters for sulfur species as well as cold traps or cold fingers with a temperature sufficiently low that the vapour pressure of the condensed sulfur species is substantially below the working pressure of desirable sulfur species in the deposition atmosphere. An example of a cold trap is a pipe through which liquid nitrogen is caused to flow at a sufficient rate and which has sufficient surface area to adequately condense the sulfur species. An example of a getter material for use in the method of the invention is a titanium sponge. The positioning of the gettering or condensing material is important so that the excess sulfur species are absorbed and/or condensed before they impinge on the deposition substrate. A preferred location for the gettering or condensing material is substantially adjacent to the primary source of the species, which is the one or more sulfide source material(s) used for deposition.

In a further embodiment of the present invention one or more additional agents may be used to remove sulfur dioxide, molecular oxygen and/or water originating from impurities in the sulfide sources such as metal sulfates or sulfites to keep the oxygen partial pressure in the deposition chamber within acceptable bounds. In other words, such an agent minimizes excess sulfur bearing species that may also contain oxygen such as for example $SO_2$ that may be volatized from the source material(s) used. In this example $SO_2$ may be condensed using a liquid nitrogen cold trap. As is understood by one of skill in the art, the acceptable pressure range is determined by routine experimentation by measuring the oxygen or water content of the deposited films relative to the desired content. For nominally oxygen-free films, the oxygen partial pressure is kept to a value lower than the base pressure for the deposition environment prior to deposition and prior to introduction of sulfur-bearing species. It should be ensured that the sulfur-bearing species do not contain oxygen. In this embodiment of the invention where water is volatized and present in the deposition chamber, a water absorbent material such as molecular sieve, as known to those of skill in the art, can be used to remove water originating from impurities in the sulfide sources or from the walls of the deposition chamber. Such water absorbent materials are but chosen so that the residual water vapour pressure above the materials is adequately low as is understood by one of skill in the art.

The method of the invention is used to control any excess sulfur-bearing species from impinging on the deposition substrate and thus into the phosphor material being deposited. However, it is still important to ensure that the deposited phosphor composition have sufficient sulfur therein in order to possess desirable luminance and luminous efficiency. A suitable source of sulfur in addition to the one or more sources comprising sulfide compounds for the purpose of ensuring that the deposited film is not deficient in sulfur is hydrogen sulfide. It is preferable that the hydrogen sulfide be cracked into atomic sulfur and hydrogen prior to admission into the deposition chamber so that atomic hydrogen is not present at the surface of the phosphor film as it is being deposited. Atomic hydrogen is highly reactive and mobile within crystal lattices, and may adversely affect the properties of the phosphor film and the underlying substrate structure. The injection rate for the hydrogen sulfide may be varied to adjust the sulfur content of the phosphor film to the desired value. The deposition temperature, deposition pressure, deposition rate and the composition of the deposition atmosphere can be adjusted to achieve the desired phosphor film composition, as known in the art.

Figure 2:
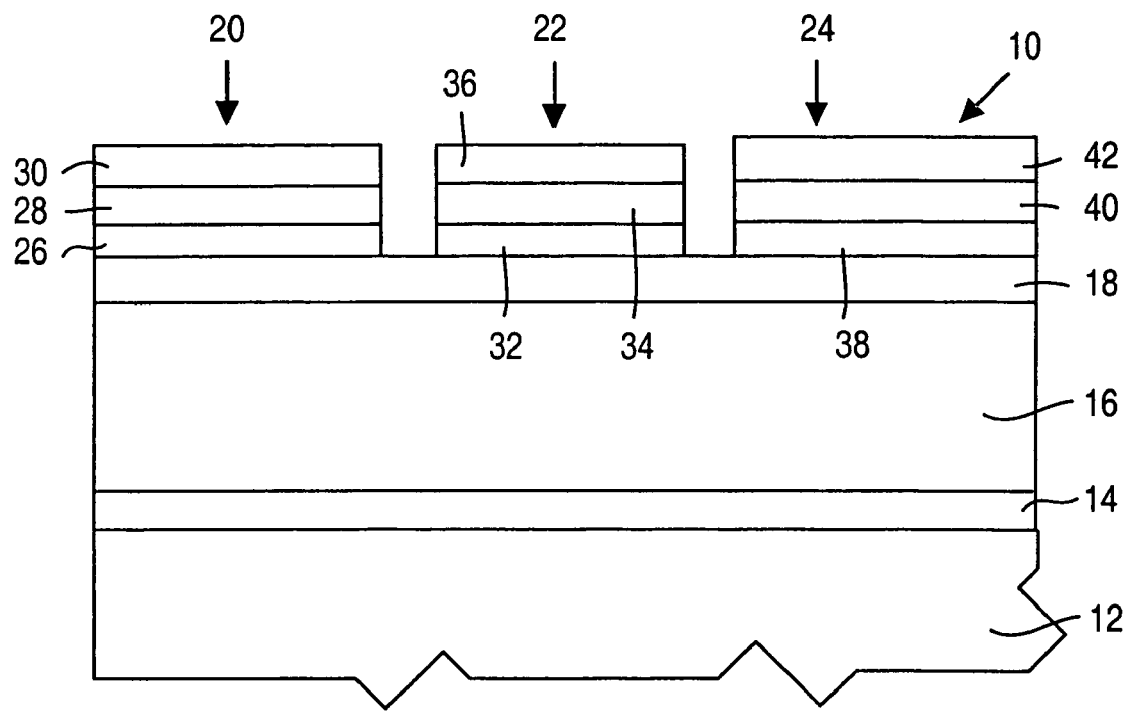
FIG. 2 is a schematic representation of a section of an electroluminescent device comprising a thick film dielectric layer and a phosphor composition.

The present invention is further illustrated by the embodiment shown in FIG. 2 that shows a cross-section of a thick film dielectric electroluminescent device incorporating a sulfur-bearing phosphor. The device, generally indicated by 10, has a substrate 12 on which is located row electrode 14. Thick film dielectric 16 has thin film dielectric 18 thereon. Thin film dielectric 18 is shown with three pixel columns, referred to as 20, 22 and 24, located thereon. The pixel columns contain sulfur bearing phosphors to provide the three basic colours viz. red, green and blue. Pixel column 20 has red phosphor 26 located in contact with thin film dielectric 18. Another thin film dielectric 28 is located on red phosphor 26, and column electrode 30 is located on thin film dielectric 28. Similarly, pixel column 22 has green phosphor 32 on thin film dielectric 18, with the thin film dielectric 34 and column electrode 36 thereon. Pixel column 24 has blue phosphor 38 on thin film dielectric 18, with thin film dielectric 40 and column electrode 42 thereon.

In an embodiment of the invention the method provides for the deposition of thin film phosphors comprising rare earth activated thioaluminates achieving high energy efficiency and high luminosity. The method can be used to deposit phosphors in the form of ternary or quaternary compounds keeping the ratio of the three or four, or more, constituent elements controlled to close tolerances to achieve optimum phosphor performance and to reduce the likelihood that the phosphor material may form into more than one crystal phase. Furthermore, the method is such to ensure that the concentration of impurities such as oxygen are kept to a minimum.

The method of the invention is applicable to thin film phosphors' with the range of phosphor compositions listed above incorporated into a thick film dielectric electroluminescent display as taught for example in Applicant's U.S. Pat. No. 5,432,015 (the disclosure of which is incorporated herein in its entirety). It is understood that the various source materials for these compositions include one or more sulfide-containing materials. The phosphor compositions may be activated with a variety of dopants, especially europium and cerium.

Stoichiometry of the deposited phosphor compositions may be controlled as disclosed in the Applicant's PCT CA01/01823 (the disclosure of which is incorporated herein by reference in its entirety). Control of stoichiometry during deposition is effected using two or more deposition source materials with different chemical compositions, together with a deposition rate measuring system for the source materials that measures the deposition rate for the sources independently from each other and a feedback system that controls the relative deposition rates commensurate with the measured rates.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

Example 1

A thick film dielectric electroluminescent device was constructed incorporating thin film phosphor layers of barium thioaluminate activated with europium. The thick film substrate was a 5 cm by 5 cm alumina substrate having a thickness of 0.1 cm. Onto this substrate was deposited a gold electrode, followed with a thick film high dielectric constant dielectric layer in accordance with the methods exemplified in Applicant's co-pending international application PCT CA00/00561 filed May 12, 2000 (the disclosure of which is incorporated herein in its entirety). A 100-200 nm thin film dielectric layer of barium titanate was deposited on top of the thick film dielectric layer using the sol gel technique described in Applicant's co-pending U.S. patent application Ser. No. 09/761,971 now U.S. Pat. No. 6,589,674 filed Jan. 17, 2001 (the entirety of which is incorporated herein by reference).

A 600 nm thick barium magnesium thioaluminate phosphor film activated with about 3 atomic percent of europium with respect to barium was electron beam deposited onto the barium titanate layer according to the methods of Applicant's International Patent Application PCT CA01/01823 (the disclosure of which is incorporated herein in its entirety).

For this example the mix of sulfur species was not controlled during the deposition of the phosphor. Following deposition the deposited phosphor was annealed under nitrogen in a belt furnace with a peak temperature of 700° C. to 750° C. for about one minute. A 50 nanometer thick aluminum nitride layer was then sputter-deposited onto the phosphor layer followed by deposition of an indium tin oxide upper conductor film according to the methods of Applicant's International Patent Application PCT CA00/00561 (the disclosure of which is incorporated herein in its entirety). The completed device was annealed in air at about 550° C. and then annealed under nitrogen at about 550° C. following deposition of the indium tin oxide and prior to testing.

Figure 3:
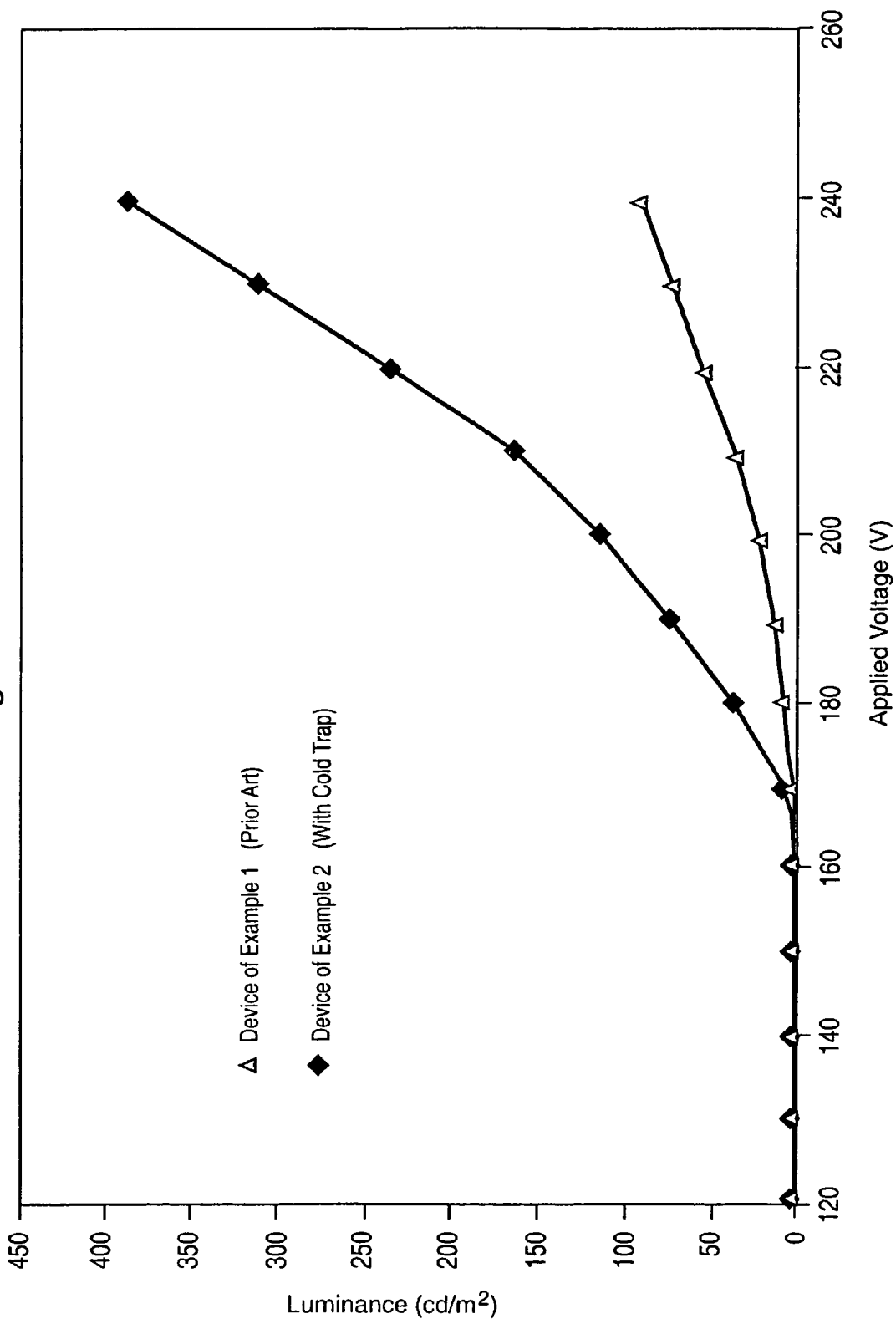
FIG. 3 is a graphical representation of the luminosity versus applied voltage of a thick film dielectric electroluminescent display having a europium activated barium thioaluminate phosphor prepared according to the methods of the prior art compared to a similar device prepared according to the method of the present invention.

The device was tested by applying a 240 Hz alternating polarity square wave voltage waveform with a pulse width of 30 nanoseconds and an amplitude of 60 volts about the optical threshold voltage. FIG. 3 shows the luminance as a function of applied voltage for the device. As can be seen from the data the luminance at 60 volts above the threshold voltage of 160 volts was about 65 candelas per square meter.

A second phosphor film was deposited on a silicon wafer adjacent to the test device during the same deposition run and analyzed by x-ray diffraction (XRD) analysis. The second phosphor film had orthorhombic sulfur present as well as barium thioaluminate phases, indicating that excess sulfur was present in or on the film. This indicated that a greater quantity of sulfur was volatilized from the sulfide sources than that expected if the volatilized species were sulfide molecules or clusters thereof. Some of the extra sulfur was in the form of elemental sulfur that condensed on the walls of the deposition chamber and re-evaporated due to fluctuations in the wall temperature to impinge and condense on the deposition substrate along with the deposited phosphor film.

Example 2

A device similar to that of example 1 was constructed but incorporating a cold trap adjacent to the barium sulfide source used for phosphor deposition. The cold trap was used to condense excess sulfur, oxygen and other volatile impurities. FIG. 3 shows the luminance as a function of applied voltage for this device. As can be seen from the data the luminance at 60 volts above the threshold voltage of 160 volts was about 240 candelas per square meter, more than three times that of the device of example 1.

A phosphor film deposited on a silicon wafer adjacent to the test sample was analyzed using XRD. It showed no sign of elemental sulfur. This example shows the benefits of the invention in preventing excess sulfur incorporation into the film and the attendant improvement realized in the device performance.

Example 3

A thick film dielectric electroluminescent display of the type generally shown in FIG. 2 was fabricated. The thick film dielectric electroluminescent display was constructed on a 5 cm by 5 cm by 1.8 mm thick PD200 glass substrate obtained from Asahi Glass Co Ltd of Tokyo, Japan onto which was deposited a 200 nm thick barrier layer of aluminum nitride. A 0.8 µm thick gold electrode film was formed on the coated substrate by printing and firing a TR1207 gold-containing paste from Tanaka Kikinzoku International of Tokyo, Japan.

Next, a composite thick film dielectric layer was fabricated on the gold lower electrode using the general methods described in Applicant's co-pending U.S. Patent Application 60/341,790 filed Dec. 21, 2002 (the entirety of which is incorporated herein by reference) but with specific process modifications described herein below.

The composite thick film dielectric layer was formed on the alumina coated glass using the following process. A thick film paste for this structure was prepared using a mixture of PMN powders, one with a particle size distribution having a d50 of 0.45 micrometers and a d90 of 0.63 and the other with a particle size distribution having a d50 of 0.36 micrometers and a d90 of 0.63. Each powder was prepared by grinding in a planetary ball mill for 2 hours and 16 hours, respectively. The powders were then mixed in a weight ratio of 1.14:1 and used to formulate the thick film paste. A first thick film layer having a thickness of about 5 µm was printed on the substrate, densified by compression and fired in the range of about 700° C. to about 720° for about 18 minutes.

The second step in forming the composite thick film dielectric layer was to deposit and fire, at about 700° C. for about 7 minutes, a 0.5 µm thick layer of PZT. This deposition was done using the MOD process described in Applicant's U.S. patent application Ser. No. 09/540,288 now U.S. Pat. No. 6,771,019 filed Mar. 31, 2000 (the entirety of which is incorporated herein by reference), with the MOD solution adjusted to have a viscosity in the range of about 9 to about 15 centipoise.

The third step in forming the composite thick film dielectric layer was to deposit, densify and fire a second PMN dielectric layer, also of a thickness of about 5 µm. The fourth step was to form a 1.6 µm thick film dielectric layer of PZT using the same process as for the second step. The fifth step was to complete the composite dielectric layer by applying a fifth layer of PZT, about 0.5 µm thick, using the same process that was used to increase the thickness of the topmost PZT layer to about 1 µm. The final step was to deposit a 150 nanometer thick barium titanate layer on the thick dielectric layer, as described in Applicant's co-pending U.S. patent application Ser. No. 09/761,971 now U.S. Pat. No. 6,589,674 filed Jan. 17, 2001 (the entirety of which is incorporated herein by reference).

Figure 4:
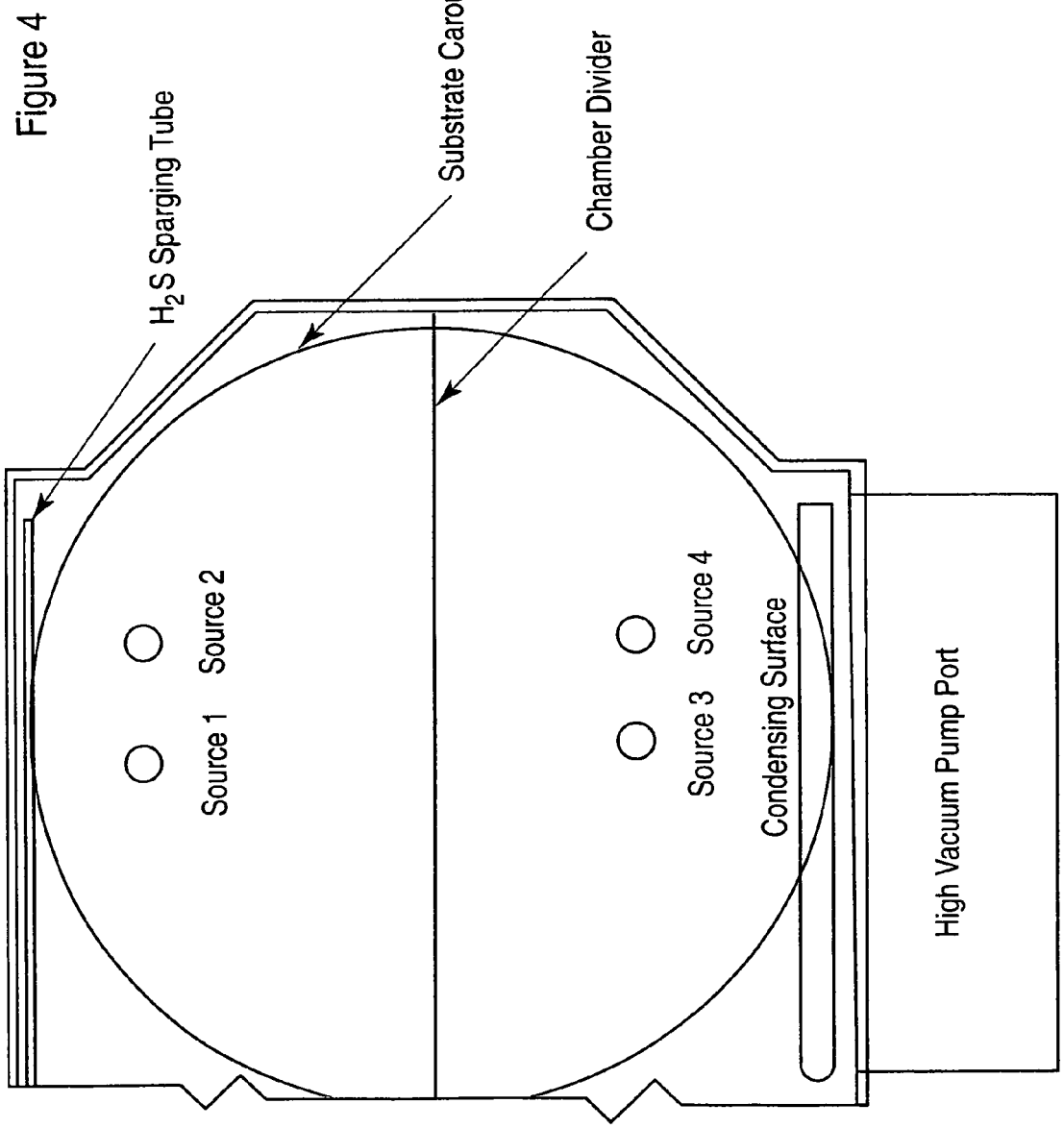
FIG. 4 is a top (plan) view of a phosphor deposition chamber in accordance with the present invention.

A 0.5 µm thick europium activated barium thioaluminate phosphor layer was electron-beam deposited on the barium titanate layer using the method described in example 2. The electron beam deposition system had four e-beam sources, two with europium doped barium sulfide and the remaining two with aluminum sulfide as the source material. The deposition system was arranged with the electron guns and sources arranged in the lower part of the chamber as indicated in the plan (top) view of the chamber shown in FIG. 4. A pumping port was connected to one side of the chamber and a hydrogen sulfide sparger was located on the opposite side of the chamber. A tube through which liquid nitrogen flowed during the deposition process was located on the same side of the chamber as the pumping port to act as a cryogenic condensing surface. The condensing surface was positioned above the sources, but below the pumping port. These features are shown in FIG. 4. The two sets of sources were separated by a wall dividing the chamber into two approximately equal volumes (also shown in FIG. 4), but with openings to permit vapour flow between the two halves. Each half of the chamber contained one barium sulfide and one aluminum sulfide source. The deposition substrates were placed on a carousel in the top portion of the chamber so they could be rotated above both halves of the chamber, alternatively being exposed to incident vapour from the two sets of sources during the deposition process.

Following phosphor deposition, and to complete the display, a 50 nm thick upper dielectric layer of aluminum nitride and a transparent electrode comprising indium tin oxide was deposited on the phosphor layer as for example 1 and the display was sealed to protect it from the ambient environment.

Figure 5:
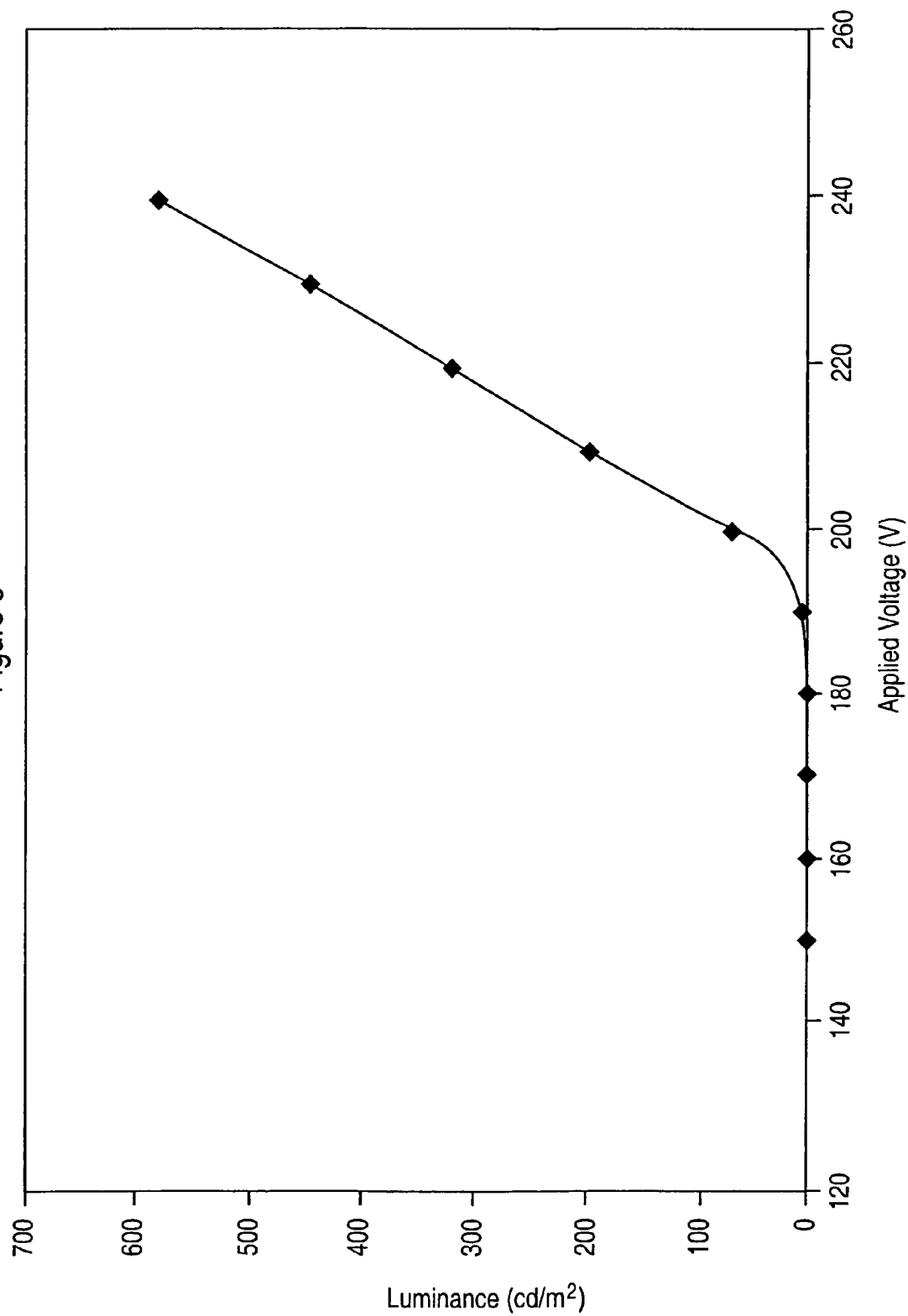
FIG. 5 is a graphical representation of the luminosity versus applied voltage of a thick film dielectric electroluminescent display having a europium activated barium magnesium thioaluminate phosphor deposited according to the method of the present invention.

The completed thick film dielectric electroluminescent display was tested using the test procedure defined in example 1. The luminance versus voltage data for this device is shown in FIG. 5. The luminance at 60 volts above the threshold voltage was about 600 candelas per square meter with a high degree of uniformity, substantially greater than for similar devices with phosphors deposited without using a cryogenic condenser. The CIE coordinates for the device were x=0.135 and y=0.099, excellent for blue emission.

Example 4

Figure 6:
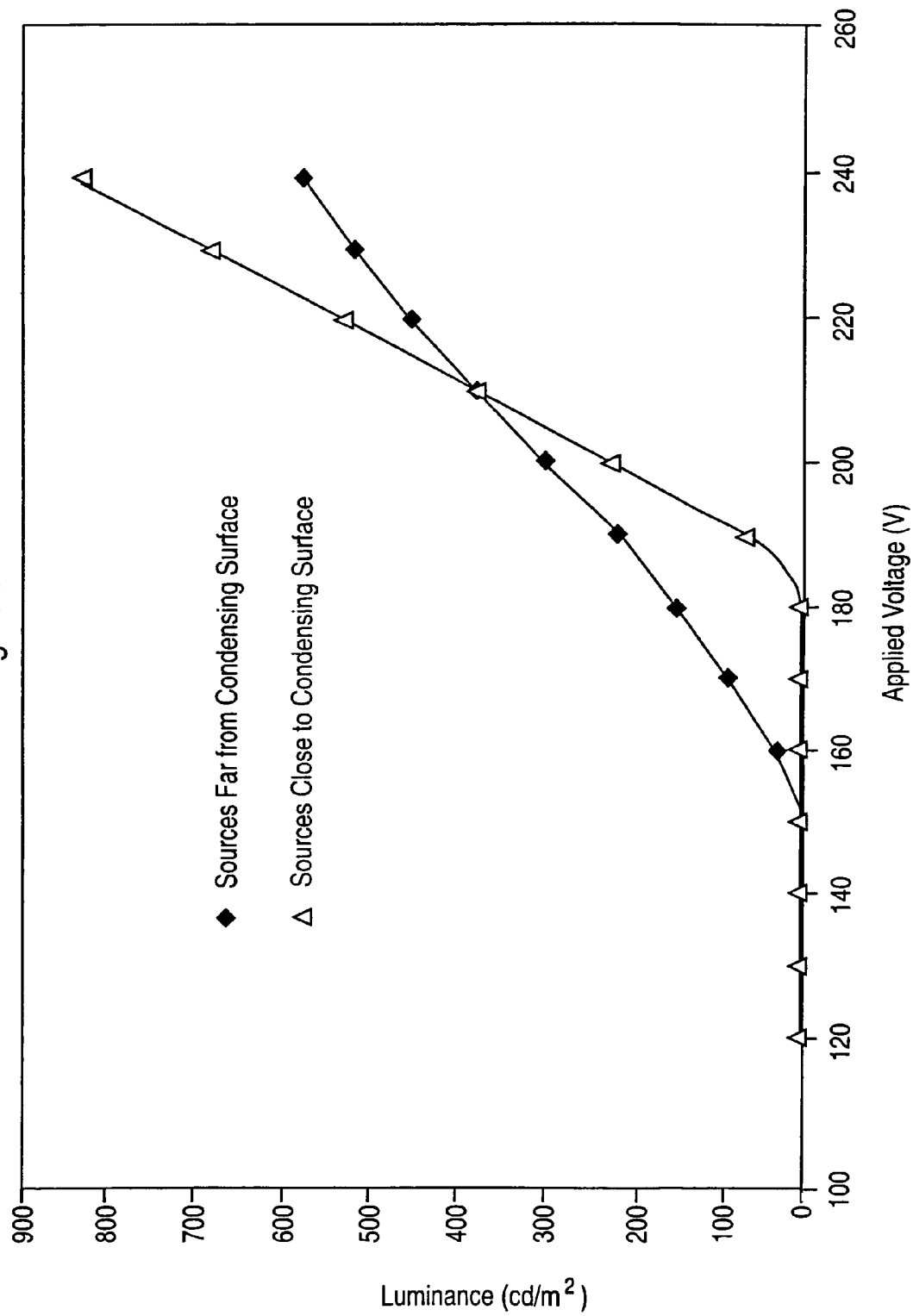
FIG. 6 is a graphical representation of the luminosity versus applied voltage of a thick film dielectric electroluminescent display having a europium activated barium thioaluminate phosphor deposited using a condenser with reduced efficiency during phosphor deposition.

A device was constructed similar to that of Example 3, however, the phosphor layer was deposited using only the two sources closest to the condensing surface. The phosphor also contained some magnesium, with a magnesium to barium atomic ratio of about 0.02 to 0.04. The luminance versus voltage data for this device is shown in FIG. 6. The luminance at 60 volts above the threshold voltage of 180 volts was about 830 candelas per square meter. For this device, the condensation of sulfur and other impurity species was more efficient than for the device of example 3, since the condensing surface was close to all of the e-beam sources, not just half of them as in example 3. Without being bound by theory, it appears that the improved luminance of this device is a result of the more efficient condensation of undesirable species.

Example 5

A device was constructed similar to that of example 4, however, the phosphor layer was deposited using the two sources furthest from the condensing surface, resulting in less efficient condensation of undesirable species. The luminance data for this device is shown in FIG. 6. The luminance at 60 volts above the threshold voltage of 150 volts was about 380 candelas per square meter, less than half that of example 4 with efficient condensation and about 65% that of the device of example 3 fabricated using an intermediate condensation efficiency. This result further supports the correlation between the condensing efficiency and the device luminance.

Although preferred embodiments of the invention have been described herein in detail, it will be understood by those skilled in the art that variations may be made thereto without departing from the spirit of the invention or the scope of the appended claims.

We claim:

1. A method for the deposition of a thin film of a pre-determined composition onto a substrate, the thin film comprising ternary, quaternary or higher sulfide compounds selected from the group consisting of thioaluminates, thiogallates and thioindates of at least one element from Groups IIA and IIB of the Periodic Table, the method comprising:
   volatizing at least one source material comprising a sulfide that forms said pre-determined composition to form a sulfur-bearing thin film composition on a substrate; and
   simultaneously minimizing any excess quantity of sulfur-bearing species volatilized from the at least one source material from impinging on said substrate, wherein said excess quantity comprises an amount in excess of that required to provide the sulfur-bearing thin film composition and wherein a gettering or condensing material is provided to minimize said excess of sulfur-bearing species.

2. The method of claim 1, wherein said material is provided substantially adjacent said at least one source.

3. The method of claim 2, wherein said material is selected from the group consisting of getters, cold traps and cold fingers.

4. The method of claim 3, wherein said material cause the sulfur impinging on the deposition substrate to have on average a substantial time invariant number of sulfur atoms per molecule.

5. The method of claim 1, wherein said volatization is conducted in an atmosphere having a low sulfur partial pressure.

6. The method of claim 5, wherein volatization is effected by a method selected from the group consisting of electron beam evaporation, thermal evaporation and sputtering.

7. The method of claim 6, wherein said method is electron beam evaporation.

8. The method of claim 5, wherein volatization is conducted at a temperature that prevents re-evaporation of sulfur-bearing species from said getting or condensing material.

9. The method of claim 5, wherein volitization is conducted in an atmosphere of reactive species selected from the group consisting of hydrogen sulfide, atomic sulfur and diatomic sulfur.

10. The method of claim 1, wherein said method additionally comprises one or more agents to condense or remove sulfur dioxide, molecular oxygen and/or water from any evaporant from said at least one source material.

11. The method of claim 10, wherein said one or more agents remove oxygen.

12. The method of claim 10, wherein said one or more agents is a liquid nitrogen cold trap.

13. The method of claim 10, wherein said one or more agents remove water.

14. The method of claim 13, wherein said one or more agents is a molecular sieve.

15. The method of claim 13, wherein said species is hydrogen sulfide.

16. The method of claim 1, wherein said pre-determined composition is a phosphor composition selected from the group consisting of europium activated barium thioaluminate and europium activated calcium thioaluminate.

17. The method of claim 1, wherein the rate of volatizing of said at least one source material is monitored and controlled.

18. The method of claim 1, wherein two source materials are present.

19. The method of claim 1, wherein three source materials are present.

20. A method for the deposition of a thin phosphor film of a pre-determined composition onto a substrate, the phosphor film comprising ternary, quaternary or higher sulfide compounds selected from the group consisting of thioaluminates, thiogallates and thioindates of at least one element from Groups IIA and IIB of the Periodic Table, the method comprising:
   volatizing at least one source material comprising a sulfide that forms said pre-determined composition to form a sulfur-bearing thin film composition on a substrate;
   simultaneously, providing a gettering or condensing material to minimize any excess quantity of sulfur-bearing species volatilized from the at least one source material from impinging on said substrate, wherein said excess quantity comprises an amount in excess of that required to provide the sulfur-bearing thin film composition; and condensing or removing oxygen and/or water from evaporant from said at least one source material.

21. The method of claim 20, wherein said gettering or condensing material is provided substantially adjacent said at least one source material.

22. The method of claim 21, wherein said gettering or condensing material is selected from the group consisting of getters, cold traps and cold fingers.

23. The method of claim 21, wherein said method additionally comprises providing one or more agents to condense or remove oxygen and/or water from any evaporant from said at least one source material.

24. The method of claim 23, wherein volatizing of said at least one source material is effected by a method selected from the group consisting of electron beam evaporation, thermal evaporation and sputtering.

25. The method of claim 23, wherein said method is conducted in an atmosphere having a low sulfur partial pressure.

26. The method of claim 25, wherein said method is conducted at a temperature to prevent re-evaporation of sulfur-bearing species from said gettering or condensing material.

27. The method of claim 26, wherein said method is conducted in an atmosphere of reactive sulfur species selected from the group consisting of hydrogen sulfide, atomic sulfur and diatomic sulfur.

28. The method of claim 26, wherein said species is hydrogen sulfide.

29. A method for the deposition of a thin film of a pre-determined composition onto a substrate, said composition comprising a ternary, quaternary or higher composition, said method comprising:
(i) providing a first pellet of a first type of sulfide as a first source material and providing a second pellet of a second type of sulfide as a second source material, the first type of sulfide and the second type of sulfide comprising the components of said pre-determined composition, at least one of said first and second pellets additionally containing dopant for said pre-determined composition;
(ii) effecting vapour deposition of said pre-determined composition onto said substrate by vaporizing said first and second pellets with an electron beam;
(iii) monitoring the rate of vaporizing of sulfides from said first and second pellets; and
(iv) simultaneously removing any excess quantity of sulfur-bearing species volatilized from said first and second pellets to inhibit said excess from impinging on said substrate, wherein said excess quantity comprises an amount in excess of that required to provide the sulfur-bearing thin film composition, and wherein the simultaneously removing includes differentially gettering the any excess quantity of sulfur-bearing species volatilized from said first and second pellets.

30. The method of claim 29, wherein the sulfide of the second source material is different from the sulfide of the first source material.

31. The method of claim 30, wherein a gettering or condensing material is provided to remove any excess quantity of sulfur species.

32. The method of claim 31, wherein said gettering or condensing material is provided substantially adjacent said first and second source and said first and second source materials.

33. The method of claim 32, wherein said gettering or condensing material is selected from the group consisting of getters, cold traps and cold fingers.

34. The method of claim 33, wherein said method additionally comprises providing one or more agents to condense or remove oxygen and/or water from any evaporant from said at least one source material.

35. The method of claim 34, wherein vaporization of said source material is effected by a method selected from the group consisting of electron beam evaporation, thermal evaporation and sputtering.

36. The method of claim 35, wherein said method is conducted in an atmosphere having a low sulfur partial pressure.

37. The method of claim 36, wherein said method is conducted at a temperature to prevent re-evaporation of sulfur-bearing species from said gettering or condensing material.

38. The method of claim 37, wherein said method is conducted in an atmosphere of reactive sulfur species selected from the group consisting of hydrogen sulfide, atomic sulfur and diatomic sulfur.

* * * * *